United States Patent [19]

Suzuki et al.

[11] Patent Number: 4,518,873

[45] Date of Patent: May 21, 1985

[54] BUFFER CIRCUIT FOR DRIVING A C-MOS INVERTER

[75] Inventors: Yasuo Suzuki, Yokohama; Hiroshi Hirao, Kawasaki; Masanori Nagasawa, Kamakura, all of Japan

[73] Assignee: Fujitsu Limited, Kawasaki, Japan

[21] Appl. No.: 407,953

[22] Filed: Aug. 13, 1982

[30] Foreign Application Priority Data

Aug. 13, 1981 [JP] Japan .............................. 56-125981

[51] Int. Cl.³ .................. H03K 17/284; H03K 17/26; H03K 17/687; H03K 17/16

[52] U.S. Cl. .................................. 307/451; 307/576; 307/585; 307/594; 307/475

[58] Field of Search ............... 307/450–453, 307/475, 481, 571, 572, 577, 579, 581, 583, 584, 585, 591, 592, 594, 605, 270, 279, 269

[56] References Cited

U.S. PATENT DOCUMENTS

| 3,551,693 | 12/1970 | Burns et al. | 307/452 X |
|---|---|---|---|
| 3,631,528 | 12/1971 | Green | 307/304 |
| 3,851,189 | 11/1974 | Moyer | 307/279 |
| 4,164,842 | 8/1979 | Ebihara | 307/270 |
| 4,317,180 | 2/1982 | Lies | 307/452 X |
| 4,329,600 | 5/1982 | Stewart | 307/571 X |
| 4,366,398 | 12/1982 | Asami | 307/451 |

FOREIGN PATENT DOCUMENTS

| 2737506 | 12/1978 | Fed. Rep. of Germany. | |
| 45726 | 3/1982 | Japan | 307/571 |

OTHER PUBLICATIONS

Electronics and Communications in Japan, "Performance of Logic LSIs Using Short Channel MOSFETs", by Minato et al., vol. 60-C, No. 9, Sep. 1977, pp. 102–109.

Primary Examiner—Stanley D. Miller
Assistant Examiner—David R. Bertelson
Attorney, Agent, or Firm—Staas & Halsey

[57] ABSTRACT

A buffer circuit for driving a C-MOS inverter, including a first inverter and a second inverter for driving a p-MOS transistor, respectively, and an n-MOS transistor in the C-MOS inverter. Each of the inverters includes at least three transistors connected in series. At least one of the three transistors in each inverter is driven by a delay circuit so that during a transition period of the C-MOS inverter, simultaneous conduction of current through the C-MOS inverter is prevented.

9 Claims, 7 Drawing Figures

BUFFER CIRCUIT FOR DRIVING A C-MOS INVERTER

BACKGROUND OF THE INVENTION

1. Field of the Invention

The present invention relates to a buffer circuit for driving a complementary metal-oxide semiconductor (C-MOS) inverter. More particularly, it relates to a buffer circuit for preventing simultaneous conduction of current through transistors in the C-MOS inverter during a transition of an input signal for the buffer inverter.

2. Description of the Prior Art

Generally, a conventional C-MOS inverter consists of a p-channel metal-oxide semiconductor (MOS) transistor (p-MOS) and an n-channel MOS transistor (n-MOS) connected in series between a power supply and a ground. In principle, no current flows from the power supply through the C-MOS inverter to ground in a steady state. This is because when one of the p-MOS or n-MOS transistors is conductive (turned on), the other is nonconductive (turned off). Therefore, there is no variation of the power supply voltage in the steady state.

During the transition period when the input of the C-MOS inverter is inverted, however, there is an instant when both transistors are conductive. At that instant, a large current flows through the C-MOS inverter. The large current causes a fluctuation in the power supply voltage, which is applied not only to the C-MOS inverter but also to the internal integrated circuit (IC) integrating the C-MOS inverter and other external circuits. The momentary variation in the power supply voltage is received by the internal IC or the external circuit as noise and often causes a circuit error operation. Therefore, it is necessary to prevent the momentary large current during the above-mentioned transition period. This is especially true when the C-MOS inverter is used as an output circuit of, for example, a memory circuit.

A C-MOS inverter is usually driven by two buffer circuits for respectively driving the p-MOS transistor and the n-MOS transistor in the C-MOS inverter. Conventionally, in order to prevent the large current during the above-mentioned transition period, the mutual conductances (gm) of the transistors, which constitute the buffer circuits are makes different from each other. This made the timing for driving the p-MOS transistor different from the timing for driving the n-MOS transistor. However, it is somewhat difficult to manufacture transistors in the buffer circuit having exactly the right mutual conductances for obtaining the desired time lag. Therefore, conventional buffer circuits cannot prevent the momentary large current during the transition period of C-MOS inverters.

SUMMARY OF THE INVENTION

Accordingly, an object of the present invention is to provide a buffer circuit for driving a C-MOS inverter, which can prevent the simultaneous conduction of current through transistors which comprise a C-MOS inverter.

Another object of the present invention is to provide a buffer circuit, for driving a C-MOS inverter able to prevent fluctuations of the power supply voltage applied to the C-MOS inverter.

Still another object of the present invention is to provide a buffer circuit for driving a C-MOS inverter, at the output stage of a semiconductor memory circuit, able to prevent erroneous operation of the semiconductor memory circuit due to fluctuations of the power supply voltage applied to the semiconductor memory circuit.

For obtaining the above objects, there is provided a buffer circuit for driving a C-MOS inverter, the C-MOS inverter including a pair of transistors, the buffer circuit including a first inverter and a second inverter for inverting an input signal and for driving the pair of transistors in the C-MOS inverter, the first and second inverters each being connected between a power supply line and ground. The first inverter has a first output connected to one of the pair of transistors, and the second inverter has a second output connected to the other of the pair of transistors. The first inverter includes at least one first switching delay transistor inserted in series between the first output and ground, and the second inverter includes at least one second switching delay transistor inserted in series between the power supply line and the second output. The first and second switching delay transistors receive a delay signal with a predetermined delay time from the input signal and the delay time is determined so as to prevent simultaneous conduction of current through the pair of transistors in the C-MOS inverter.

BRIEF DESCRIPTION OF THE DRAWINGS

The above objects and advantages as well as other features of the present invention will be more apparent from the following description of the embodiments in conjunction with the accompanying drawings, wherein.

DESCRIPTION OF THE PREFERRED EMBODIMENTS

Figure 1:
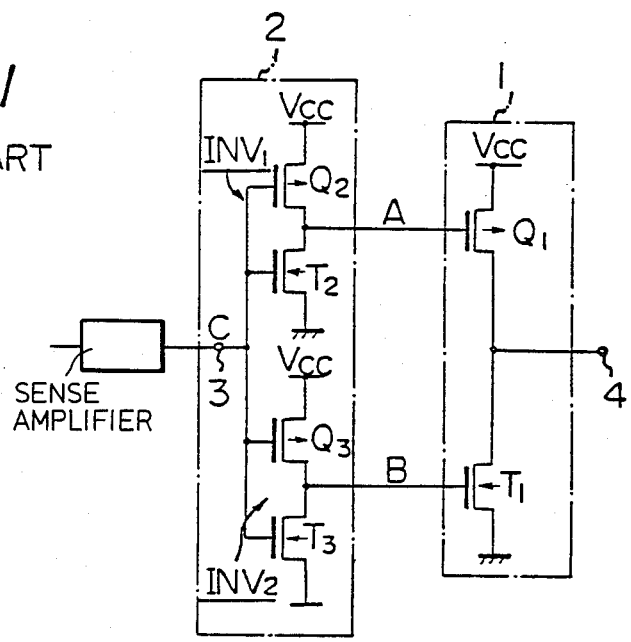
FIG. 1 is a circuit diagram of a conventional buffer circuit for driving a C-MOS inverter.

Before describing the embodiments of the present invention, a conventional example and its disadvantages will first be described with reference to FIGS. 1 and 2. In FIG. 1, reference numeral 1 is a C-MOS inverter, 2 is a conventional buffer circuit for driving the C-MOS inverter 1, 3 is an input end of the buffer circuit 2, and 4 is an output end of the C-MOS inverter 1. Reference symbol SA represents a sense amplifier in a memory circuit. The C-MOS inverter 1 consists of a first p-MOS transistor $Q_1$ and a first n-MOS transistor $T_1$ connected in series between a power supply line $V_{CC}$ and ground. The buffer circuit 2 consists of a first inverter $INV_1$ for driving the first p-MOS transistor $Q_1$ and a second inverter $INV_2$ for driving the first n-MOS transistor $T_1$. The first inverter $INV_1$ consists of a second p-MOS transistor $Q_2$ and a second n-MOS transistor $T_2$ connected in series between the power supply line $V_{CC}$ and ground. The second inverter $INV_2$ also consists of a third p-MOS transistor $Q_3$ and a third n-MOS transistor $T_3$ connected in series between the power supply line $V_{CC}$ and ground. The gates of the transistors in the buffer circuit 2 are commonly connected to the input end 3. The input end 3 is connected through the sense amplifier SA to a memory cell array (not shown). The connecting point between the p-MOS transistor $Q_2$ and the n-MOS transistor $T_2$, i.e., the output end of the first inverter $INV_1$, is connected to the gate of the first p-MOS transistor $Q_1$ in the C-MOS inverter 1. The connecting point between the p-MOS transistor $Q_3$ and the n-MOS transistor $T_3$, i.e., the output end of the second inverter $INV_2$, is connected to the gate of the first n-MOS transistor $T_1$ in the C-MOS inverter 1. The connecting point between the first p-MOS transistor $Q_1$ and the first n-MOS transistor $T_1$ is connected to the output end 4. In order to obtain a time lag between the output voltages A and B of the outputs of the first and second inverters $INV_1$ and $INV_2$, the mutual conductance gm of the second n-MOS transistor $T_2$ is made smaller than that of the third n-MOS transistor $T_3$, or the mutual conductance gm of the second P-MOS transistor $Q_2$ is made greater than that of the third P-MOS transistor $Q_3$.

During the transition period when the input voltage C at the input end 3 falls from the power supply voltage (H level) to ground voltage (L level) and when the input voltage C becomes lower than the threshold voltages of the p-MOS transistors $Q_2$ and $Q_3$, the p-MOS transistors $Q_2$ and $Q_3$ are switched from their nonconductive states to their conductive states. When the input voltage becomes lower than the threshold voltages of the n-MOS transistors $T_2$ and $T_3$, the n-MOS transistors $T_2$ and $T_3$ are switched from their conductive states to their nonconductive states.

Figure 2:
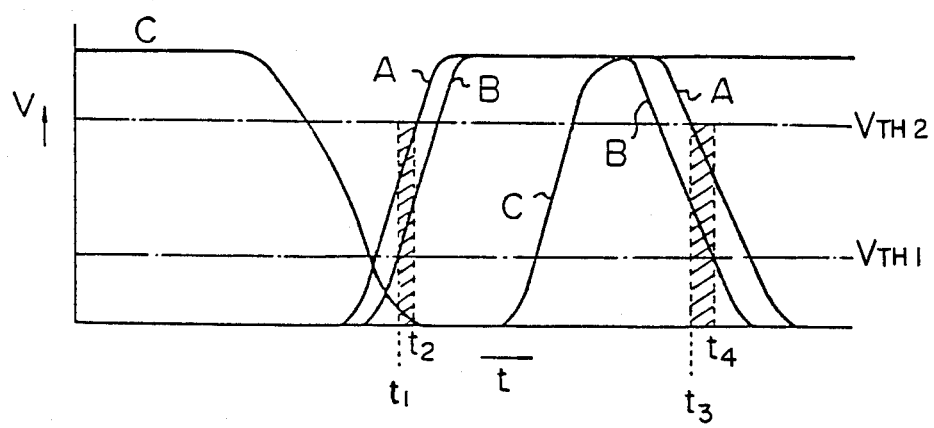
FIG. 2 is a waveform diagram of the relationship between the input voltages and the output voltages of the buffer circuit in FIG. 1.

Since the mutual conductance gm of the p-MOS transistor $Q_2$ is made greater than that of the p-MOS transistor $Q_3$, the output voltage A rises earlier than the output voltage B, as illustrated in FIG. 2. The output voltages A and B are applied to the gates of the p-MOS transistor $Q_1$ and n-MOS transistor $T_1$ in the C-MOS inverter, respectively. The time lag of the output voltage B from the output voltage A while rising is $\tau_0$.

If the time lag $\tau_0$ could be made large, the p-MOS transistor $Q_1$ and n-MOS transistor $T_1$ in the C-MOS inverter 1 would not be simultaneously turned on. However, since the time lag $\tau_0$ is usually too small, as illustrated in FIG. 2, there is an instant when both the p-MOS transistor $Q_1$ and n-MOS transistor $T_1$ are turned on. That is, as shown in FIG. 2, $t_1$ is the time the output voltage B of the second inverter $INV_2$ reaches the threshold voltage $V_{TH1}$ of the n-MOS transistor $T_1$ in the C-MOS inverter 1 and switches the n-MOS transistor $T_1$ from a nonconductive state to a conductive state. Now, $t_2$ is the time shortly after the time $t_1$ when the output voltage A of the first inverter $INV_1$ reaches the threshold voltage $V_{TH2}$ of the p-MOS transistor $Q_1$ in the C-MOS inverter 1 and switches the p-MOS transistor $Q_1$ from a conductive state to a nonconductive state. Therefore, as shown in FIG. 2, during the period between the times $t_1$ and $t_2$, both the p-MOS transistor $Q_1$ and the n-MOS transistor $T_1$ in the C-MOS inverter 1 are in their conductive states. As a result, a large current flows from the power supply line $V_{CC}$ through the C-MOS inverter to ground.

Substantially the same discussion as described above applies to the rising of the input voltage C. Accordingly, during the time $t_3$ and $t_4$, a large current also flows through the C-MOS inverter.

As mentioned before, a large current flowing through the C-MOS inverter causes fluctuation of the power supply voltage $V_{CC}$ and ground. This fluctuation of the power supply voltage causes serious errors in internal or external circuits connected to the same power supply line $V_{CC}$ and ground. The problem is especially serious in circuits which require a plurality of C-MOS inverters, for example, in semiconductor memory circuits. In such circuits, the large currents flowing through the C-MOS inverters accumulate to cause a considerable amount of voltage fluctuation in the power supply line.

Instead of designing the mutual conductance gm of the p-MOS transistor $Q_2$ to be greater than that of the p-MOS transistor $Q_3$, the mutual conductance gm of the n-MOS transistor $T_2$ may be made smaller than that of the n-MOS transistor $T_3$. This design also results in a time lag between the rising or falling waveforms of the output voltages A and B.

In any case, since it is difficult to fabricate an MOS transistor having the right mutual conductance gm, the rising or falling waveforms of the output voltages of a conventional buffer circuit sometimes become close to each other, as illustrated in FIG. 2. Therefore, when a C-MOS inverter is driven by a conventional buffer circuit, the instantaneous large current cannot surely be prevented from flowing through the C-MOS inverter during a transition period.

Figure 3:
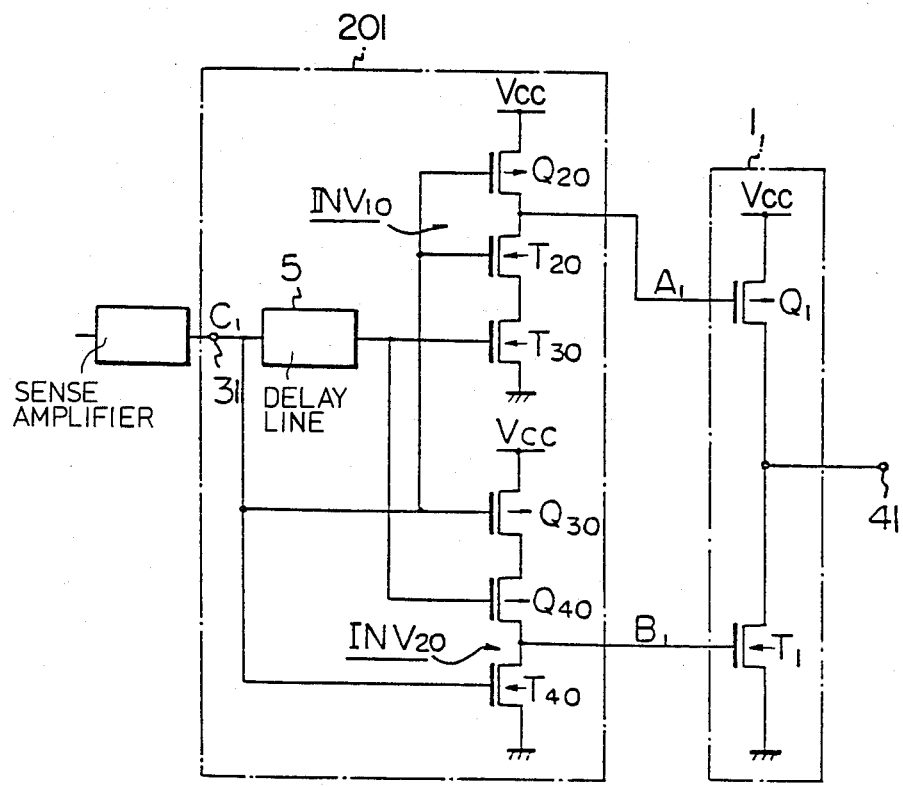
FIG. 3 is a circuit diagram of a buffer circuit for driving a C-MOS inverter according to an embodiment of the present invention.

Embodiments of the present invention will now be described. In FIG. 3 a buffer circuit 201 is shown for driving the C-MOS inverter 1. The C-MOS inverter 1 is the same as that in FIG. 1. The buffer circuit 201 of this embodiment comprises a first inverter $INV_{10}$ for driving the first p-MOS transistor $Q_1$ and a second inverter $INV_{20}$ for driving the first n-MOS transistor $T_1$. The first inverter $INV_{10}$ comprises three transistors, i.e., a second p-MOS transistor $Q_{20}$, a second n-MOS transistor $T_{20}$, and a third n-MOS transistor $T_{30}$ connected in series between the power supply line $V_{CC}$ and ground. The second inverter $INV_{20}$ comprises three transistors, i.e., a third p-MOS transistor $Q_{30}$, a fourth p-MOS transistor $Q_{40}$, and a fourth n-MOS transistor $T_{40}$ connected in series between the power supply line $V_{CC}$ and the ground. A delay circuit 5 is provided between an input end 31 and the gates of the n-MOS transistor $T_{30}$ and the p-MOS transistor $Q_{40}$. The gates of the p-MOS transistor $Q_{20}$ and the n-MOS transistor $T_{20}$ in the first inverter $INV_{10}$, and the gates of the p-MOS transistor $Q_{30}$ and the n-MOS transistor $T_{40}$ in the second inverter $INV_{20}$, are commonly connected to the input end 31. The gate of the n-MOS transistor $T_{30}$ in the first inverter $INV_{10}$ and the gate of the p-MOS transistor $Q_{40}$ are commonly connected to the output of the delay circuit 5. The input end 31 is connected through the sense amplifier SA to a memory circuit (not shown). The output of the first inverter $INV_{10}$, i.e., the connecting point between the p-MOS transistor $Q_{20}$ and the n-MOS transistor $T_{20}$, is connected to the gate of the p-MOS transistor $Q_1$ in the C-MOS inverter 1. The output of the second inverter $INV_{20}$, i.e., the connecting point between the p-MOS transistor $Q_{40}$ and the n-MOS transistor $T_{40}$, is connected to the gate of the n-MOS transistor $T_1$ in the C-MOS inverter 1. The output of the C-MOS inverter 1, i.e., the connecting point between the p-MOS transistor $Q_1$ and the n-MOS transistor $T_1$, is connected to an output terminal 41.

The main differences between the circuit of FIG. 1 and the circuit of FIG. 3 are that, in FIG. 3, the first inverter $INV_{10}$ includes the additional n-MOS transistor $T_{30}$, the second inverter $INV_{20}$ includes the additional p-MOS transistor $Q_{40}$ and the buffer circuit 30 includes the additional delay circuit 5. In this embodiment, it is not necessary to have different mutual conductances in the transistors in the buffer circuit 201 in order to prevent the instantaneous large current flowing through the inverter 1. Therefore, all the mutual conductances of $Q_{20}$, $T_{20}$, $T_{30}$, $Q_{30}$, $Q_{40}$ and $T_{40}$ can be determined only for the speed of driving the inverter.

Figure 4:
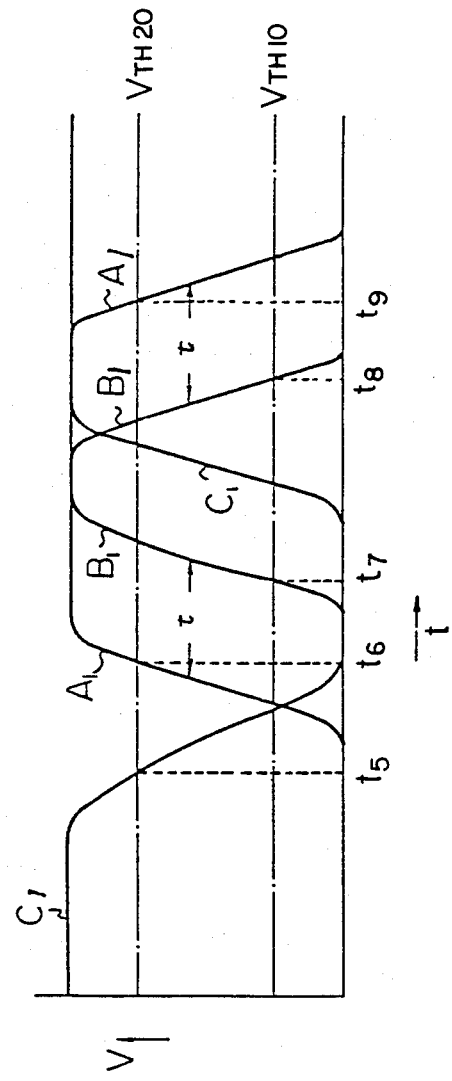
FIG. 4 is a waveform diagram of the relationship between the input voltages and the output voltages of the buffer circuit in FIG. 3.

The operation of the circuit of FIG. 3 is now described with reference to FIG. 4. During the transition period when the input voltage $C_1$ at the input end 31 falls from the H level to the L level and when the input voltage $C_1$ at the input end 31 reaches the threshold voltage $V_{TH20}$ of the p-MOS transistors at a time $t_5$, the p-MOS transistors $Q_{20}$ and $Q_{30}$, the gates of which are directly connected to the input end 31, are switched from their nonconductive states to their conductive states. When the input voltage $C_1$ further decreases to reach the threshold voltage $V_{TH10}$ of the n-MOS transistors, the n-MOS transistors $T_{20}$ and $T_{40}$, the gates of which are directly connected to the input end 31, are switched from their conductive states to their nonconductive states. In the first inverter $INV_{10}$, after the input voltage $C_1$ becomes lower than the threshold voltage $V_{TH10}$, the p-MOS transistor $Q_{20}$ is in the conductive state and the n-MOS transistor $T_{20}$ is in the nonconductive state. Therefore, the output voltage $A_1$ of the first inverter $INV_1$ begins to rise. At a time $t_6$, when the output voltage $A_1$ reaches the threshold voltage $V_{TH20}$ of the p-MOS transistor $Q_1$, the p-MOS transistor $Q_1$ is switched from on to off. On the other hand, in the second inverter $INV_{20}$, at the time $t_5$, the p-MOS transistor $Q_{40}$ is not turned on because its gate receives the delayed input voltage from the delay circuit 5. Therefore, the output voltage $B_1$ begins to rise with a delay time $\tau$ after the rising of the output voltage $A_1$ of the first inverter $INV_{10}$. At a time $t_7$, when the output voltage $B_1$ reaches the threshold voltage $V_{TH10}$ of the n-MOS transistor $T_1$, the n-MOS transistor $T_1$ is switched from off to on. As a result, the output voltage at the output end of the C-MOS inverter 1 is switched from the H level to the L level. Before the time $t_6$, only the p-MOS transistor $Q_1$ is in the conductive state. In the period between the time $t_6$ and $t_7$, both the p-MOS transistor $Q_1$ and n-MOS transistor $T_1$ are in the nonconductive state. After the time $t_7$, only the n-MOS transistor $T_1$ is in the conductive state. Accordingly, during the transition when the input voltage $C_1$ falls, no momentary current flows from the power supply line $V_{CC}$ through the p-MOS transistor $Q_1$ and n-MOS transistor $T_1$ to ground.

During the rising of the input voltage $C_1$, the n-MOS transistor $T_{30}$ in the first inverter $INV_{10}$ is turned on at the predetermined delay time $\tau$ after the n-MOS transistor $T_{40}$ in the second inverter $INV_{20}$ is turned on. Therefore, the output voltage $A_1$ of the first inverter $INV_{10}$ falls with the delay time $\tau$ after the fall of the output voltage $B_1$ of the second inverter $INV_{20}$. The n-MOS transistor $T_1$ is turned off at a time $t_8$. After the time $t_8$, the p-MOS transistor $Q_1$ is turned on at a time $t_9$. Before the time $t_8$, only the n-MOS transistor $T_1$ is in the conductive state. Between the time $t_8$ and $t_9$, both the p-MOS transistor $Q_1$ and n-MOS transistor $T_1$ are in the nonconductive states. After the time $t_9$, only the p-MOS transistor $Q_1$ is in the conductive state. Accordingly, no current flows through the C-MOS inverter 1 during the rising of the input voltage $C_1$.

Figure 5:
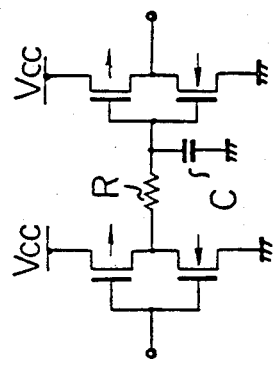
FIG. 5 is a circuit diagram of an example of a delay circuit used in the circuit of FIG. 3.

FIG. 5 shows an example of a well-known delay circuit which functions as the delay circuit 5 in FIG. 3. The delay circuit of FIG. 5 comprises two inverters and a time constant circuit with a resistor R and a capacitor C. The resistance and the capacitance are appropriately determined so as to obtain the desired delay time $\tau$.

Figure 6:
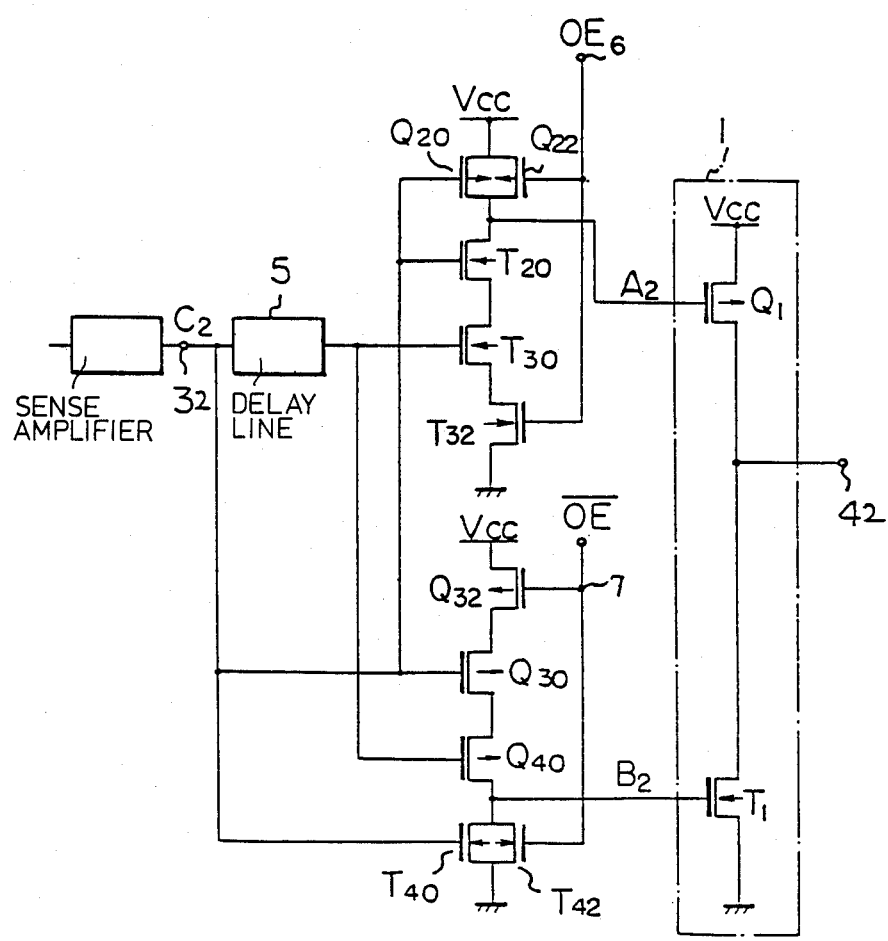
FIG. 6 is a circuit diagram of a buffer circuit for driving a C-MOS inverter according to a second embodiment of the present invention.

The number of transistors in each inverter in the buffer circuit may alternatively be four or more so as to realize three states, i.e., the L level, the H level, and a high impedance state, at the output of the C-MOS inverter 1. FIG. 6 is a buffer circuit for realizing the three states at the output of a memory circuit. The main difference between FIG. 3 and FIG. 6 is that, in FIG. 6, additional transistors $Q_{22}$, $T_{32}$, $Q_{32}$, and $T_{42}$ are provided. The p-MOS transistor $Q_{22}$ is connected in parallel with the p-MOS transistor $Q_{20}$. The n-MOS transistor $T_{32}$ is inserted between the n-MOS transistor $T_{30}$ and the ground. The p-MOS transistor $Q_{32}$ is inserted between the power supply line $V_{CC}$ and the p-MOS transistor $Q_{30}$. The n-MOS transistor $T_{42}$ is connected in parallel with the n-MOS transistor $T_{40}$. The gates of the p-MOS transistor $Q_{22}$ and the n-MOS transistor $T_{32}$ are commonly connected to a terminal 6 which receives a noninverted output enable signal. The gates of the p-MOS transistor $Q_{32}$ and the N-MOS transistor $T_{42}$ are commonly connected to another terminal 7 which receives an inverted output enable signal.

In a standby state of the memory circuit, the output enable signal OE is at the L level, and the inverted output enable signal $\overline{OE}$ is at the H level. Therefore, the p-MOS transistor $Q_{22}$ is on and the n-MOS transistor $T_{32}$ is off, so that the output voltage $A_2$ is at the H level regardless of the input voltage $C_2$. Accordingly, the p-MOS transistor $Q_1$ is off regardless of the input voltage $C_2$. Also, the p-MOS transistor $Q_{32}$ is off and the n-MOS transistor $T_{42}$ is on, so that the output voltage $B_2$ is at the L level regardless of the input voltage $C_2$. Consequently, the output of the inverter 1 is at a high impedance.

In an active state of the memory circuit, the output enable signal OE is at the H level and the inverted output enable signal $\overline{OE}$ is at the L level. Therefore, the p-MOS transistor $Q_{22}$ is off and the n-MOS transistor $T_{32}$ is on, so that the output voltage $A_2$ is at the H level or the L level depending on the L level or the H level of the input voltage $C_1$, respectively. Also, the p-MOS transistor $Q_{32}$ is on and the N-MOS transistor $T_{42}$ is off, so that the output voltage $B_2$ is at the H level or the L level depending on the L level or the H level of the input voltage $C_2$, respectively. The delay circuit 5 in FIG. 6 also gives a predetermined delay to the rising and falling of the output voltages $A_2$ and $B_2$, in a similar way as in the circuit of FIG. 3.

Figure 7:
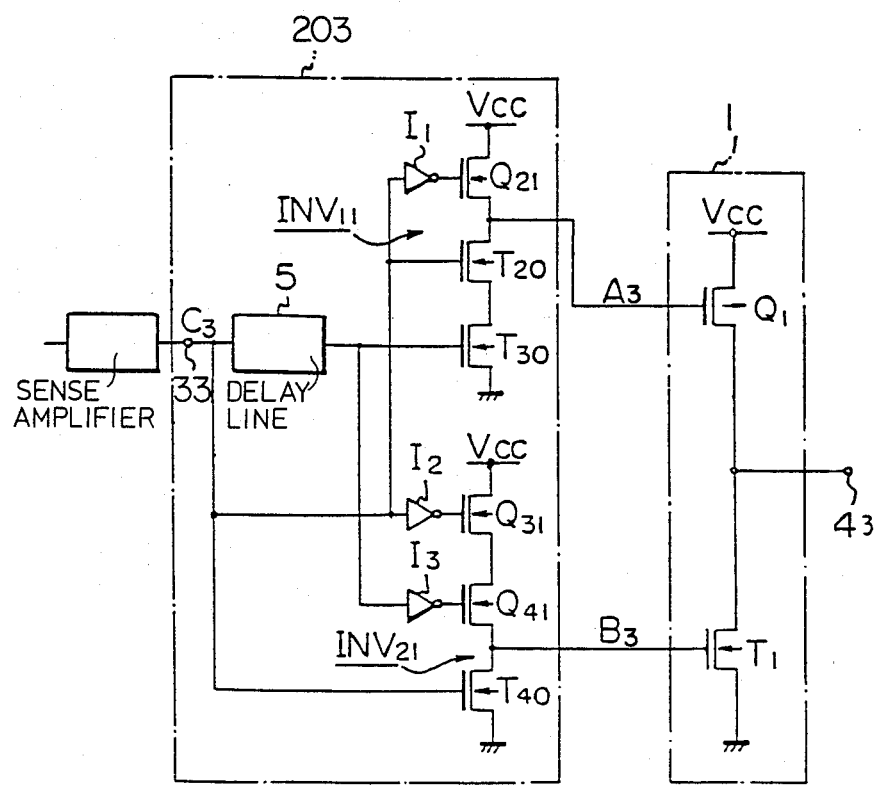
FIG. 7 is a circuit diagram of a buffer circuit for driving a C-MOS inverter according to a third another embodiment of the present invention.

In FIG. 7, a third embodiment of a buffer circuit is illustrated. In this embodiment, the buffer circuit 203 comprises n-MOS transistors. No p-MOS transistors are used in this buffer circuit 203. In place of the p-MOS transistors $Q_{20}$, $Q_{30}$, and $Q_{40}$ in FIG. 3, n-MOS transistors $Q_{21}$, $Q_{31}$, and $Q_{41}$ are used in FIG. 7, respectively. Between the gate of the n-MOS transistor $Q_{21}$ and the input end 33, a first inverter $I_1$ is inserted. Between the gate of the n-MOS transistor $Q_{31}$ and the input end 33, a second inverter $I_2$ is inserted. Between the gate of the n-MOS transistor $Q_{41}$ and the output of the delay circuit 5, a third inverter $I_3$ is inserted. This construction enables a similar effect to be obtained as in the circuit of FIG. 3, as will be apparent to those skilled in the art.

The present invention is not restricted to the above-mentioned embodiments. Various other changes and modifications are possible without departing from the spirit of the invention. For example, the gates of the n-MOS transistors $T_{20}$ and $T_{30}$ may alternatively be connected to the output of the delay circuit 5 and to the input end 3, respectively. Also, the gates of the p-MOS transistors $Q_{30}$ and $Q_{40}$ may alternatively be connected to the output of the delay circuit 5 and to the input end 3, respectively. Further, the input signal of the buffer circuit may be supplied not only from the sense amplifier in the memory circuit but also from any other logic circuit.

From the foregoing description, it will be apparent that, according to the present invention, since each of the two inverters for driving a p-MOS transistor and an n-MOS transistor in a C-MOS inverter comprises at least three transistors and since a delay circuit is inserted between an input end and the inverters, a desired delay time can be given to the driving time of the transistors in the C-MOS inverter. As a result, simultaneous conduction of current through the transistors in the C-MOS inverter during its transition state can be prevented. Therefore, the voltage fluctuation of the power supply line, to which the C-MOS inverter and internal or external circuits of the C-MOS inverter are connected, is suppressed. Further, power consumption in the C-MOS inverter is decreased.

We claim:

1. A buffer circuit, operatively connected to receive an input signal, for driving a C-MOS inverter having first and second transistors, said buffer circuit comprising:
   first and second inverters operatively connected between a power supply line and ground and operatively connected to receive the input signal, for inverting the input signal and for providing an output signal for driving the first and second transistors in the C-MOS inverter, said first inverter having a first output terminal operatively connected to the first transistor and comprising at least one first switching delay transistor operatively connected in series between the power supply line and ground, said second inverter having a second output terminal operatively connected to the second transistor and comprising at least one second switching delay transistor operatively connected in series between the power supply line and ground;
   delay means, operatively connected to said first and second inverters and operatively connected to receive the input signal, for providing a delay signal having a predetermined delay time with respect to the input signal; and
   said first and second switching delay transistors receiving the delay signal from said delay means, having a predetermined delay time with respect to the input signal to prevent simultaneous conduction of current through the first and second transistors in the C-MOS inverter.

2. A buffer circuit as set forth in claim 1:
   wherein the first and second transistors in the C-MOS inverter comprise a p-MOS transistor and an n-MOS transistor, respectively;
   wherein said first inverter further comprises at least two more transistors, operatively connected in series with each other and said first switching delay transistor and operatively connected to said p-MOS transistor, for driving said p-MOS transistor;
   wherein said second inverter further comprises at least two more transistors, operatively connected in series with each other and said second switching delay transistor and operatively connected to said n-MOS transistor, for driving said n-MOS transistor.

3. A buffer circuit as set forth in claim 2:
   wherein said one of at least two more transistors of said first inverter comprises a first p-MOS transistor operatively connected to the power supply line and wherein the other one of said at least two more transistors comprises a first n-MOS transistor operatively connected in series with said first p-MOS transistor, the connection of said first p-MOS transistor and said first n-MOS transistor forming a first connection point therebetween;
   wherein said first output terminal is operatively connected to said first connection point;
   wherein the first switching delay transistor comprises a second n-MOS transistor operatively connected in series between said first n-MOS transistor and ground;
   wherein said one of at least two more transistors of said second inverter comprises a second p-MOS transistor operatively connected to the power supply and wherein the other one of said at least two more transistors of said second inverter comprises a third n-MOS transistor operatively connected to ground;
   wherein the second switching delay transistor of said second inverter comprises a third p-MOS transistor operatively connected in series between said second p-MOS transistor and said third n-MOS transistor, the connection of said third p-MOS transistor and said third n-MOS transistor forming a second connection point therebetween; and
   wherein said second output terminal is operatively connected to said second connection point.

4. A buffer circuit as set forth in claim 2:
   wherein said one of at least two more transistors of said first inverter comprises a first p-MOS transistor operatively connected to the power supply line, wherein the first switching delay transistor of said first inverter comprises a first n-MOS transistor operatively connected to ground, and wherein the other of said at least two more transistors comprises a second n-MOS transistor operatively connected in series between said first p-MOS transistor and said first n-MOS transistor, the connection of said first p-MOS transistor and said second n-MOS transistor forming a first connection point therebetween;
   wherein said first output terminal is operatively connected to said first connection point;
   wherein said one of at least two more transistors of said second inverter comprises a third n-MOS transistor operatively connected to ground, wherein the second switching delay transistor of said second inverter comprises a second p-MOS transistor operatively connected in series with said third n-MOS transistor, and wherein the other of said at least two more transistors comprises a third p-MOS transistor operatively connected in series between the power supply line and said second p-MOS transistor, the connection of said second p-MOS transistor and said third n-MOS transistor forming a second connection point therebetween; and wherein said second output terminal is operatively connected to said second connection point.

5. A buffer circuit as set forth in claim 2:

wherein said first switching delay transistor and said at least two more transistors of said first inverter comprise n-MOS transistors operatively connected in series between the power supply and ground, wherein a first one of said at least two transistors is operatively connected to receive an inverted signal of the input signal, wherein a second one of said at least two transistors is operatively connected to receive the input signal, and wherein said first switching delay transistor is operatively connected to receive the delay signal, the connection between said first and second transistors forming a first connection point therebetween, and wherein said first output terminal is operatively connected to said first connection point; and wherein said second switching delay transistor and said at least two more transistors of said second inverter comprise n-MOS transistors operatively connected in series between the power supply and ground, wherein a first one of said at least two transistors of said second inverter is operatively connected to receive the inverted input signal, wherein said second switching delay of said second inverter is operatively connected to receive an inverted signal of the delay signal, and wherein a second one of said at least two transistors of said second inverter is operatively connected to receive the input signal, the connection between said second and third transistors forming a second connection point therebetween, and wherein said second output terminal is operatively connected to said second connection point.

6. A buffer circuit, having an input terminal operatively connected to receive an input signal and having a output for driving a C-MOS inverter circuit having a first p-MOS transistor and a first n-MOS transistor operatively connected in series between a power supply and ground and having an output terminal, said buffer circuit comprising:

a first inverter circuit, having an output node operatively connected to the first p-MOS transistor and having an input node operatively connected to the input terminal, for receiving the input signal and for driving the first p-MOS transistor;

a second inverter circuit, having an output node operatively connected to the first n-MOS transistor and having an input node operatively connected to the input terminal, for receiving the input signal and for driving the first n-MOS transistor; and a delay circuit, operatively connected between the input terminal and said first and second inverters, for receiving the input signal and generating a delay signal having a predetermined delay time.

7. A buffer circuit as set forth in claim 6, wherein said first inverter circuit comprises:

a second p-MOS transistor operatively connected to the power supply and the input terminal;

a second n-MOS transistor, operatively connected to the input terminal and operatively connected in series with said second p-MOS transistor, forming a first connection node therebetween, the first connection node operatively connected to said output node of said first inverter circuit; and a third n-MOS transistor operatively connected to said delay circuit, said second n-MOS transistor and ground, and wherein said second inverter circuit comprises:

a third p-MOS transistor, operatively connected to the power supply and the input terminal;

a fourth p-MOS transistor operatively connected to said third p-MOS transistor and said delay circuit; and a fourth n-MOS transistor, operatively connected to ground, the input terminal, and operatively connected in series with said fourth p-MOS transistor, forming a second connection node therebetween, the second connection node operatively connected to the output node of said second inverter.

8. A buffer circuit as set forth in claim 7, further comprising:

a first terminal operatively connected to receive and supply an output enable signal; and a second terminal operatively connected to receive and supply an inverted output enable signal; and wherein said first inverter circuit further comprises:

a fifth p-MOS transistor, operatively connected in parallel with said second p-MOS transistor and operatively connected to said first terminal;

a fifth n-MOS transistor, operatively connected to said first terminal, said third n-MOS transistor and ground; and wherein said second inverter circuit further comprises:

a sixth p-MOS transistor operatively connected to said second terminal, the power supply and said third p-MOS transistor; and a sixth n-MOS transistor, operatively connected to said second terminal and in parallel with said fourth n-MOS transistor.

9. A buffer circuit as set forth in claim 6, further comprising:

a first inverter operatively connected between the input terminal and said input node of said first inverter circuit;

a second inverter operatively connected between said input node of said second inverter circuit and the input terminal; and a third inverter operatively connected between said delay circuit and said second inverter circuit;

wherein said first inverter circuit comprises:

a second n-MOS transistor operatively connected to the power supply and said input node of said first inverter circuit;

a third n-MOS transistor operatively connected to the input terminal and connected in series with said second n-MOS transistor forming a first connection node therebetween, the first connection node operatively connected to the first p-MOS transistor; and a fourth n-MOS transistor, operatively connected to said delay circuit, said third n-MOS transistor and ground; and wherein said second inverter circuit comprises:

a fifth n-MOS transistor, operatively connected to the power supply and said input node of said second inverter circuit;

a sixth n-MOS transistor operatively connected to said third inverter and in series with said fifth n-MOS transistor; and a seventh n-MOS transistor, operatively connected to ground, the input terminal and connected in series with said sixth n-MOS transistor forming a second connection node therebetween, the second connection node operatively connected to the first n-MOS transistor.

* * * * *

UNITED STATES PATENT AND TRADEMARK OFFICE
CERTIFICATE OF CORRECTION

PATENT NO. : 4,518,873
DATED : MAY 21, 1985
INVENTOR(S) : YASUO SUZUKI ET AL.

It is certified that error appears in the above-identified patent and that said Letters Patent is hereby corrected as shown below:

FRONT PAGE [57] ABSTRACT
line 3, delete ", respectively,";
line 4, after "tor" insert --, respectively,--.

Col. 1, line 49, "circuits" should be --circuits,--;
line 49, "makes" should be --made--;
line 50, "made" should be --makes--.

Col. 9, line 45, "a" should be --an--.

Signed and Sealed this

Eighth Day of October 1985

[SEAL]

Attest:

DONALD J. QUIGG

Attesting Officer

Commissioner of Patents and
Trademarks—Designate